United States Patent [19]

Tegge

[11] Patent Number: 5,479,425

[45] Date of Patent: Dec. 26, 1995

[54] THERMAL COMPENSATION OF INJECTION LASER DIODES DRIVEN BY SHUNT CURRENT MODULATIONS

[75] Inventor: Edward Tegge, Palm Bay, Fla.

[73] Assignee: Harris Corporation, Melbourne, Fla.

[21] Appl. No.: 346,266

[22] Filed: Nov. 23, 1994

[51] Int. Cl.$^6$ ..................................................... H01S 3/13
[52] U.S. Cl. .................................................. 372/29; 372/38
[58] Field of Search ................................. 372/29, 38, 31, 372/32

[56] References Cited

U.S. PATENT DOCUMENTS

| | | | |
|---|---|---|---|
| 4,884,280 | 11/1989 | Kinoshita | 372/38 |
| 5,123,023 | 6/1992 | Santarelli et al. | 372/29 |
| 5,313,482 | 5/1994 | Zelenka et al. | 372/29 |
| 5,412,675 | 5/1995 | Odagawa | 372/29 |

OTHER PUBLICATIONS

Wittke et al; "Stabilization of CW Injection Lasers"; RCA Technical Notes; TN No.:1005; Apr. 9, 1975.

Primary Examiner—Leon Scott, Jr.
Attorney, Agent, or Firm—Rogers & Killeen

[57] ABSTRACT

A laser driver for an injection laser diode (ILD) protects the ILD during ILD temperature changes so that the ILD is not subjected to a potentially harmful operating current. The ILD may be operated near it maximum limit and modulated by decreasing the available current to the ILD. The temperature of the ILD may be sensed and the maximum ILD driving current changed proportionally to a change of the sensed temperature.

22 Claims, 4 Drawing Sheets

THERMAL COMPENSATION OF INJECTION LASER DIODES DRIVEN BY SHUNT CURRENT MODULATIONS

BACKGROUND OF THE INVENTION

The present invention relates to image reproduction;systems, and more particularly to a laser driver for an injection laser diode and method of operating a laser driver in a high resolution laser recorder.

Laser image recorders may use a semiconductor laser diode (referred to herein as an injection laser diode, "ILD") to reproduce an image on a photographic media. The image is typically provided to the recorder in the form of digital or analog data that is used to modulate the ILD output to expose the photographic media. Due to the nature of the data and image, the operation of the device is complex. For example, recording resolution may be on the order of 300 pixels per inch, yielding nearly eight million pixels for an eight inch by eleven inch image. The image may be reproduced in about a half a minute (over 264,000 ILD operations per second) and may have 256 shades of gray with eight bits per pixel to describe the shading. Laser image recorders find application in a variety of fields, such as reconnaissance, medical (e,g,. X-ray image reproduction), satellite imagery, computer-generated graphics, and the like.

The image reproduction process involves numerous steps in which an error in one step maybe magnified in the next, and one of the more vexing problems encountered throughout the process is that of the effect of temperature on ILD operation. While the present invention addresses several problems, it may be more clearly understood by considering the invention as it addresses the temperature problems at several steps.

Baseline Drift. Consider first the affect of temperature on the stability of the signal from the laser driver that controls ILD output. The relative range of operation of a laser driver for an ILD may be from 1 to 4000, and throughout this range the ILD desirably maintains a precise transfer function between the electrical input signal Vin (the information-bearing portion of the input), and the optical output power, Pout:

$$Pout = mVin + b \quad (1)$$

where, m is the gain of the laser driver, and b is the power offset of the laser driver. That is, the laser driver signal for controlling ILD output may be viewed as having a variable (modulated) information-bearing portion, mVin, and a fixed power offset (baseline) portion, b.

The stability of the offset b is highly desirable to the maintenance of a precise transfer function. However, changes in temperature (as well as other factors such as aging) cause the power offset b to drift (offset drift is also denoted baseline drift). The temperature changes that may cause baseline drift may be felt in various components and attempts to maintain the temperature of all the components have not proven workable in many applications. Drift control measures that rely on feedback have proven more successful. However, feedback methods for wide bandwidth, wide dynamic range laser drivers require a large number of components with very high stability.

ILD Protection. Temperature may also affect ILD operation more directly because an ILD will be destroyed if it is provided with a current that exceeds a maximum value. Significantly, the allowable maximum current value changes with temperature. By way of further explanation, and with reference to FIG. 1, an ILD operating at the intersection of lines A and B (25° C., curve 2) may be provided with the forward current shown (the total of variable and fixed portions) and have the optical output power shown. If the forward current remains fixed, but the ILD temperature drops to 0° C. (curve 1) the ILD will have exceeded its maximum output and be destroyed. On the other hand, if the ILD temperature rises to 50° C. (curve 3) and the current remains on line A, the ILD's output will be reduced. The temperature curves such as shown in FIG. 1 are inherent characteristics of ILDs.

Several methods have been employed to protect the ILDs. One is to limit the amount of current available to drive the ILD by inserting a large ohmage resistor between the ILD and the available power source (voltage). The available current is thereby limited to:

$$I = (V - Vd)/R \quad (2)$$

where V is available voltage, Vd is ILD "on" voltage, and R is the ohmage of the limiting resistor. In this approach, the problem of temperature induced variations of maximum current is resolved by setting the maximum available current (by selection of R) at a value less than a value that would destroy the ILD at anticipated operating temperatures. This, of course, limits the range of operation of the ILD. Further, the resistor dissipates power, and the large ohmage of the resistor limits the bandwidth of ILD modulation.

In another method of protecting the ILD, the optical output power of the ILD is monitored and a corrective feedback signal is generated to lower or stop the ILD drive signal when a predetermined maximum power has been exceeded. However, a significant amount of time is needed to determine whether the maximum power has been exceeded, to feed a signal back to the laser driver, and for the laser driver to take corrective action. This time delay limits the bandwidth and the dynamic range over which the ILD can be used.

Accordingly, it is an object of the present invention to provide a novel device and method of operating a laser driver in which the ILD is not subjected to potentially harmful currents that obviates the problems of the prior art.

It is another object of the present invention to provide a novel device and method of operating a laser driver in which the ILD is modulated by decreasing the available current so that a maximum current is not exceeded when the ILD is modulated.

It is still another object of the present invention to provide a novel device and method of operating a laser driver in which the current available to drive the ILD is varied responsive to temperature changes of the ILD.

It is yet another object of the present invention to provide a novel device and method of operating a laser driver in which the current available to drive the ILD is varied by operating a transistor with a base current related to two, signals, one signal responsive to temperature changes of the ILD and the other signal not affected by temperature changes.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 2:
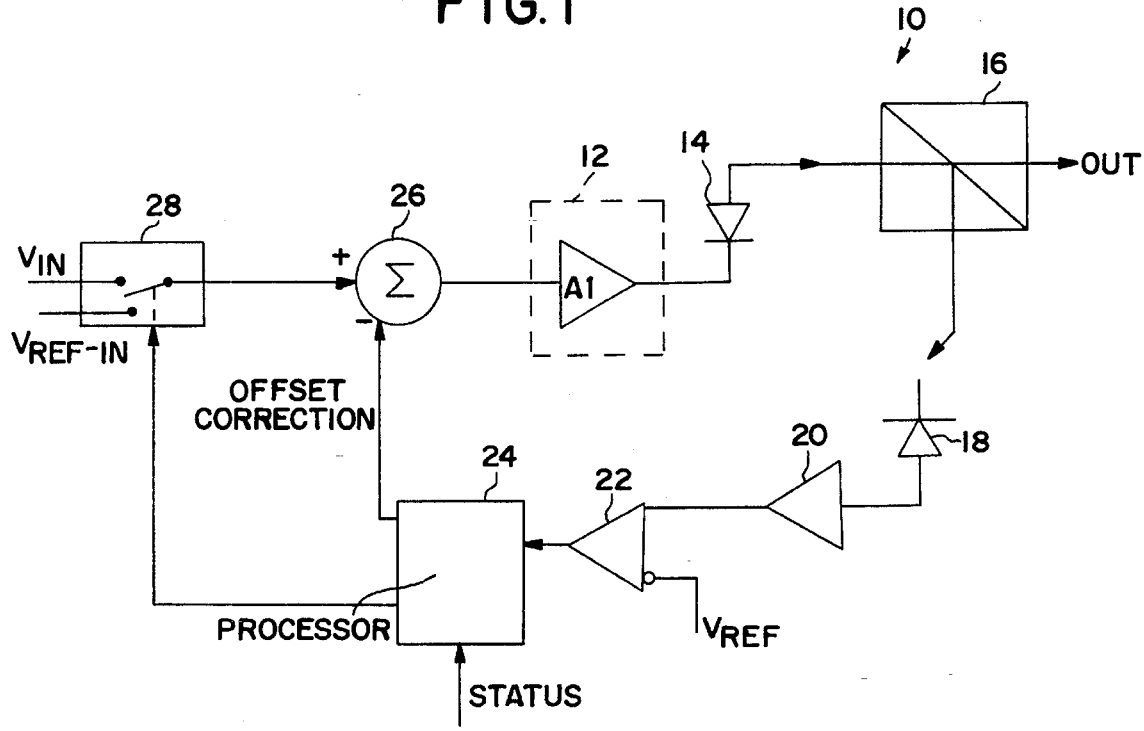
FIG. 2 is a block diagram of an embodiment of the baseline drift correction circuit of the present invention.

With reference now to FIG. 2, a circuit 10 in a laser driver for correcting baseline drift may include a servo circuit 12, discussed further below, for providing a drive signal to an ILD 14. The drive signal includes an input modulated portion (mVin from Equation 1 above) and a power offset (b from Equation 1) provided by the servo circuit 12. A portion of the ILD output is split off in beamsplitter 16 and provided to a detector 18. The output from the detector 18 may be amplified in amplifier 20 and provided to comparator 22. In the comparator 22, the detected output is compared to a predetermined reference voltage Vref and the result of that comparison is fed to a processor 24 that generates a baseline correction signal during certain intervals of circuit 10 operation discussed below. The baseline correction signal is provided to summer 26 for correction of the power offset from the servo circuit 12.

In the operation of the circuit 10, the processor 24 operates switch 28 based on an evaluation of a status signal indicating whether information bearing signals are being processed. The status signal may be provided to the laser driver conventionally to indicate when information signals are being provided. The input signal Vin is selected by switch 28 when information-bearing signals are being processed and output from the ILD, such as when pixels are being generated. When information-bearing signals are not being provided in an interval of operation of the laser driver, such as at the end of line of pixels, the switch 28 selects a reference signal Vref-in as an input. The reference Signal Vref-in desirably is a stable, low drift reference voltage that causes the ILD to generate an output that is the power offset provided by the servo circuit 12, and that also includes noise that may be present in the circuit 10. This output is compared in comparator 22 to a stable, low drift reference voltage Vref that is substantially the same as the desired, stable power of set b. If the power offset provided by the servo circuit 12 is correct (that is, it is equal to b) the only difference sensed by comparator 22 will be the noise in the circuit 10. If the power offset provided by the servo circuit 12 is not correct, the comparator provides an indication to the processor which sends an offset correction signal to the summer to compensate for the incorrect offset. The offset correction may be provided continuously to the summer 26, but the correction is not changed when information bearing signals are being processed.

In a preferred embodiment the comparator 22 is a one bit converter for providing a single bit error signal indicating which way the offset is to be corrected. The error signal may indicate the larger of the detected signal from the detector 18 and the signal Vref.

The noise sensed by the comparator 22 may be reduced by integrating a plurality N of the correction signals. The processor 24 may store the correction signals and compute a running average of the last N signals. The running average may be used to provide correction signals to the summer 26 that reduce noise by the square root of N, and to compute the quantitative value of the power offset. The processor 24 may convert the running average to an analog signal for the summer 26. In a preferred embodiment the correction signals are one bit error signals and N is 128.

Figure 3:
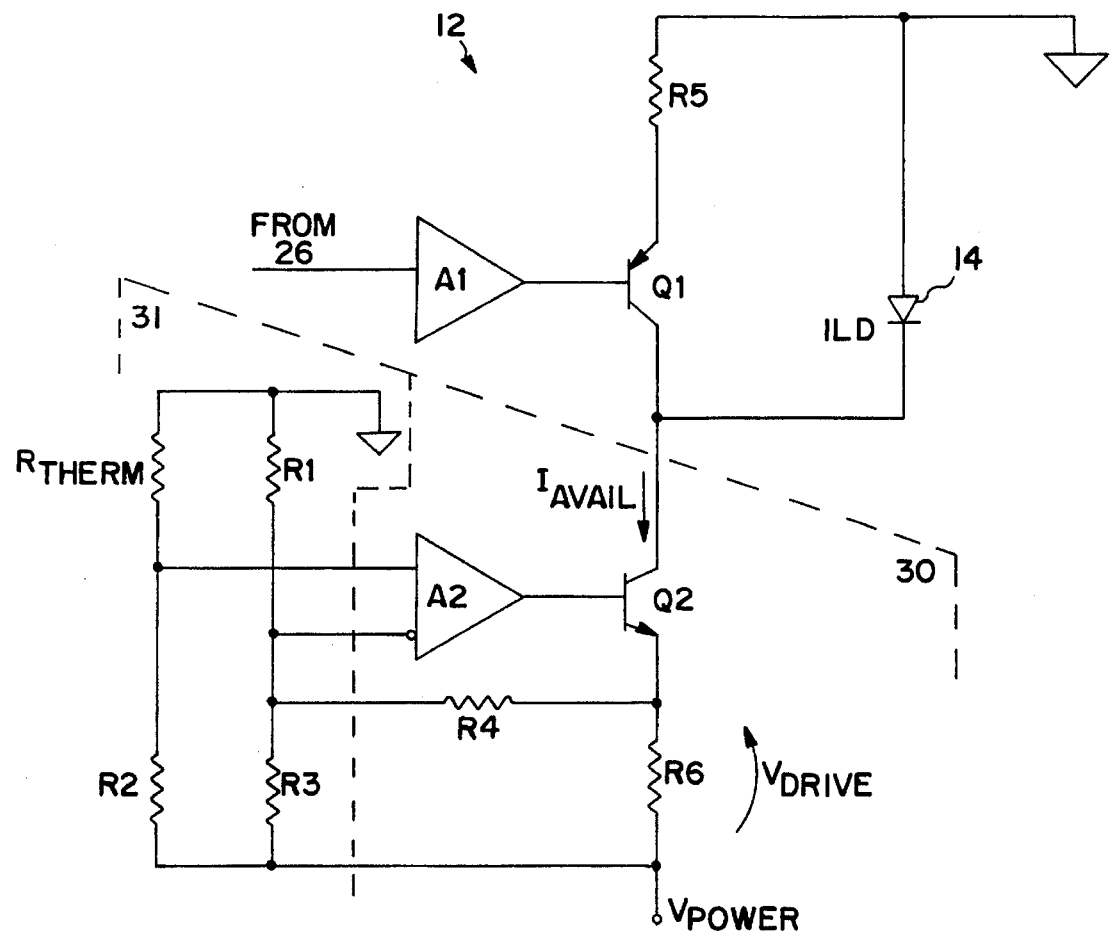
FIG. 3 is a block diagram of an embodiment of the ILD protection circuit of the present invention.

With reference now to, FIG. 3 a laser driver servo circuit 12 for providing a drive signal to an ILD may also protect an ILD, and to this end may include circuitry 30 that may include a bridge network 31 and voltage source Vpower for varying the current available Iavail to drive the ILD as a function of ILD temperature. The circuitry 30 controls the maximum current available to drive the ILD by varying the drive voltage Vdrive responsive to ILD temperature changes so that the ILD will not be destroyed. A thermistor Rtherm in the bridge network 31 may be located adjacent (e.g., thermally bonded) to the ILD so that it may sense ILD temperature variations.

Figure 1:
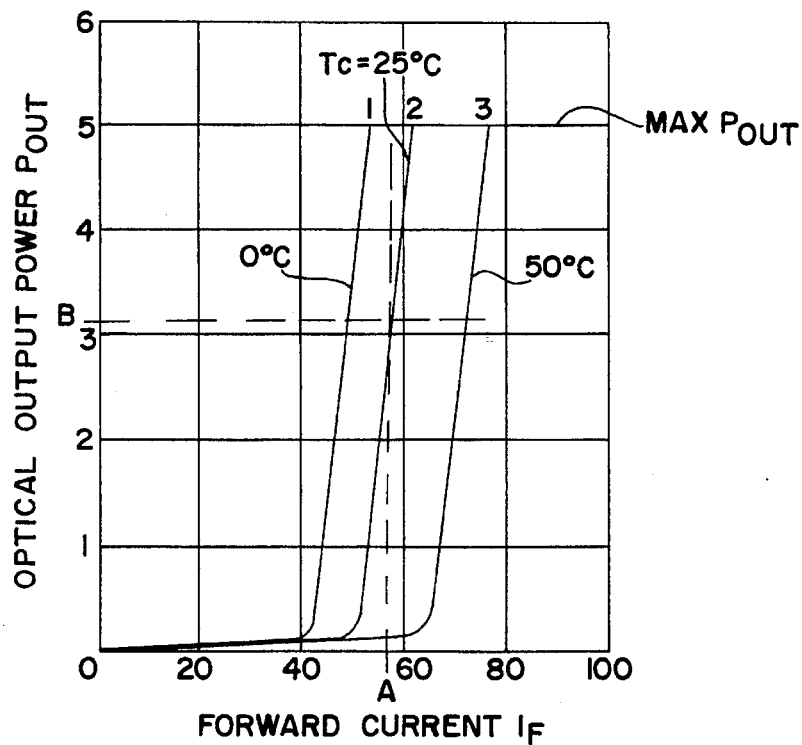
FIG. 1 is a graph illustrating an example of ILD optical output power versus forward current as a function of ILD temperature.

The available current Iavail may be provided to the ILD through a transistor Q2 that receives a base current from and has its output voltage modified by amplifier A2. The inputs to the amplifier A2 are a first voltage Vtemp that is responsive to ILD temperature changes and a second voltage Vintemp that is not. These two voltages may be developed by the bridge network 31 having fixed resistors, R1, R2, and R3, and the thermistor Rtherm. The bridge network 31 may be connected between the power voltage Vpower and ground. The values of R1, R2, and R3 and of the amplifier feedback resistor R4 may be selected so that the drive voltage Vdrive does not change with changes of Vpower. This selection causes the current available Iavail to be insensitive to changes in Vpower. Thus, the circuitry 30 provides two levels of stability: first, as the temperature of the ILD 14 changes, the current available to drive the ILD is changed by the amount needed to protect the ILD while maintaining its full operating range, and second, in the event Vpower fluctuates the bridge 31 and circuitry 30 change Vdrive so that Iavail remains constant. With reference to FIG. 1, the circuitry 30 keeps the ILD on its proper temperature curve by increasing available (forward) current as ILD temperature increases and decreasing available (forward) current as ILD temperature decreases.

The servo circuit 12 may also operate the ILD at an "on" level so that modulation operates by shunting available current to turn the laser "off". That is, many prior art lasers operated by operating the laser "off" and modulated the output by increasing the available current to turn the laser "on". The servo circuit 12 may operate in the reverse by shunting current away from the ILD when the output is to be modulated. As may be seen in FIG. 3, the amplifier A1 receives an input signal from the summer 26 (FIG. 2) land drives transistor Q1 to shunt current away from ILD 14. Desirably all of the current is shunted (near zero current available for the ILD) during "low" or "off" modulation. With the circuit 12 operating in this manner the maximum operating current cannot be exceeded by the modulation.

Figure 4A:
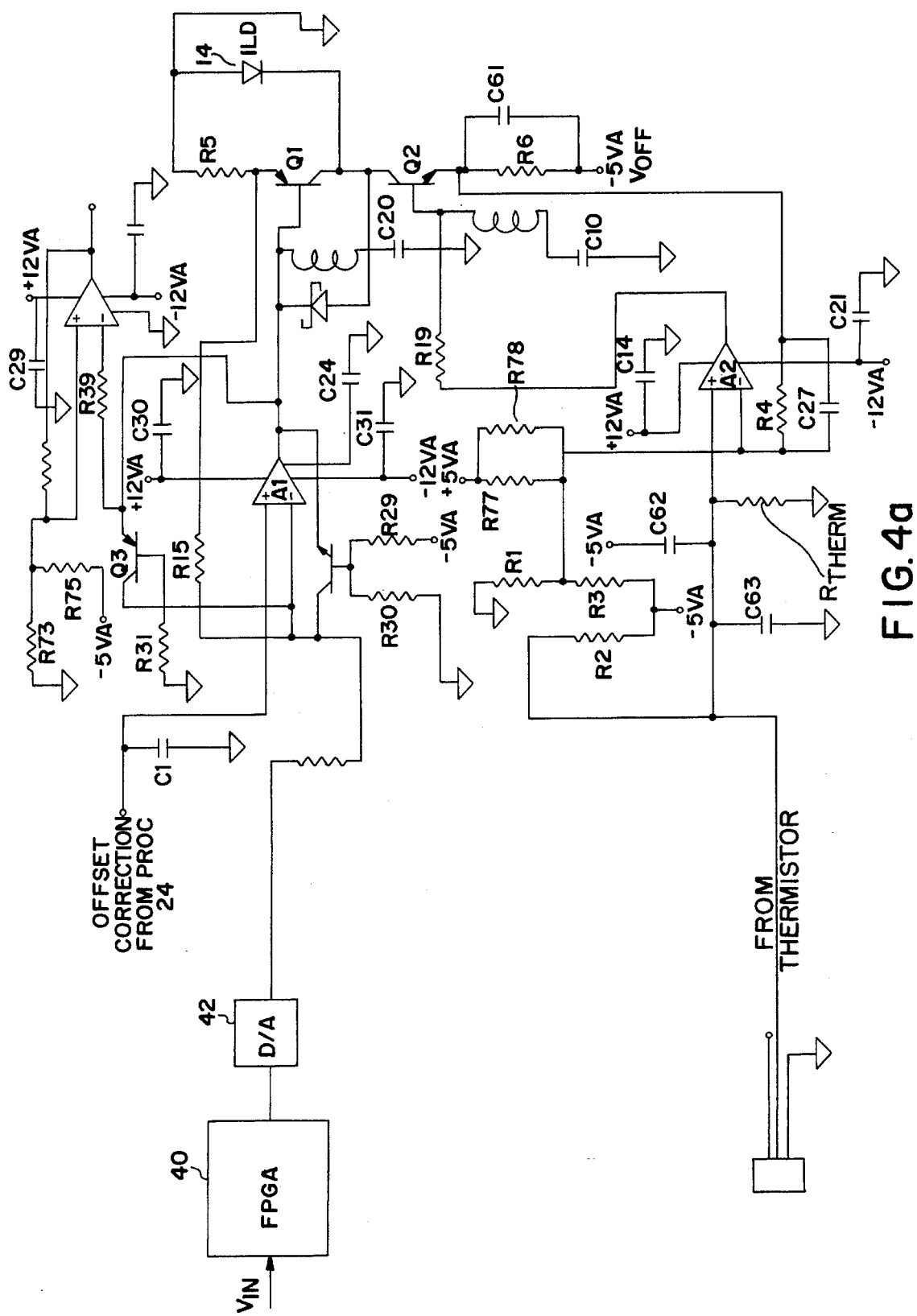
FIGS. 4a–4b are circuit diagrams of portions of an embodiment of the present invention.

In a preferred embodiment of the present invention, and with reference to FIG. 4a, an input video signal Vin may be a serial, differential digital word (differential signals have a positive part and a negative part) that may be conventionally converted to a single ended signal. Component identifiers from FIGS. 2 and 3 have been retained in FIGS. 4a –4b for similar components in the interest of clarity. The single ended word may be fed to a digital switch in a field programmable gate array (FPGA) 40 that performs the functions of switch 28. The output of the FPGA 40 may be fed to a digital to analog converter 42 that provides an analog signal to a circuit that performs the functions of the summer 26 and servo circuit 12. The offset correction from the processor 24 and the analog signal from converter 42 are provided to amplifier A1 that drives transistor Q1 that operates in the manner discussed above in relation to FIG. 3. The FPGA 40 may also provide Vref-in and the converter 42 may convert the signal to analog when the reference input is selected in switch 28.

With further reference to FIG. 4a, an embodiment of the ILD protection circuit may include amplifier A2 driving transistor Q2 to vary the drive voltage responsive to temperature changes sensed by the thermistor Rtherm.

Figure 4B:
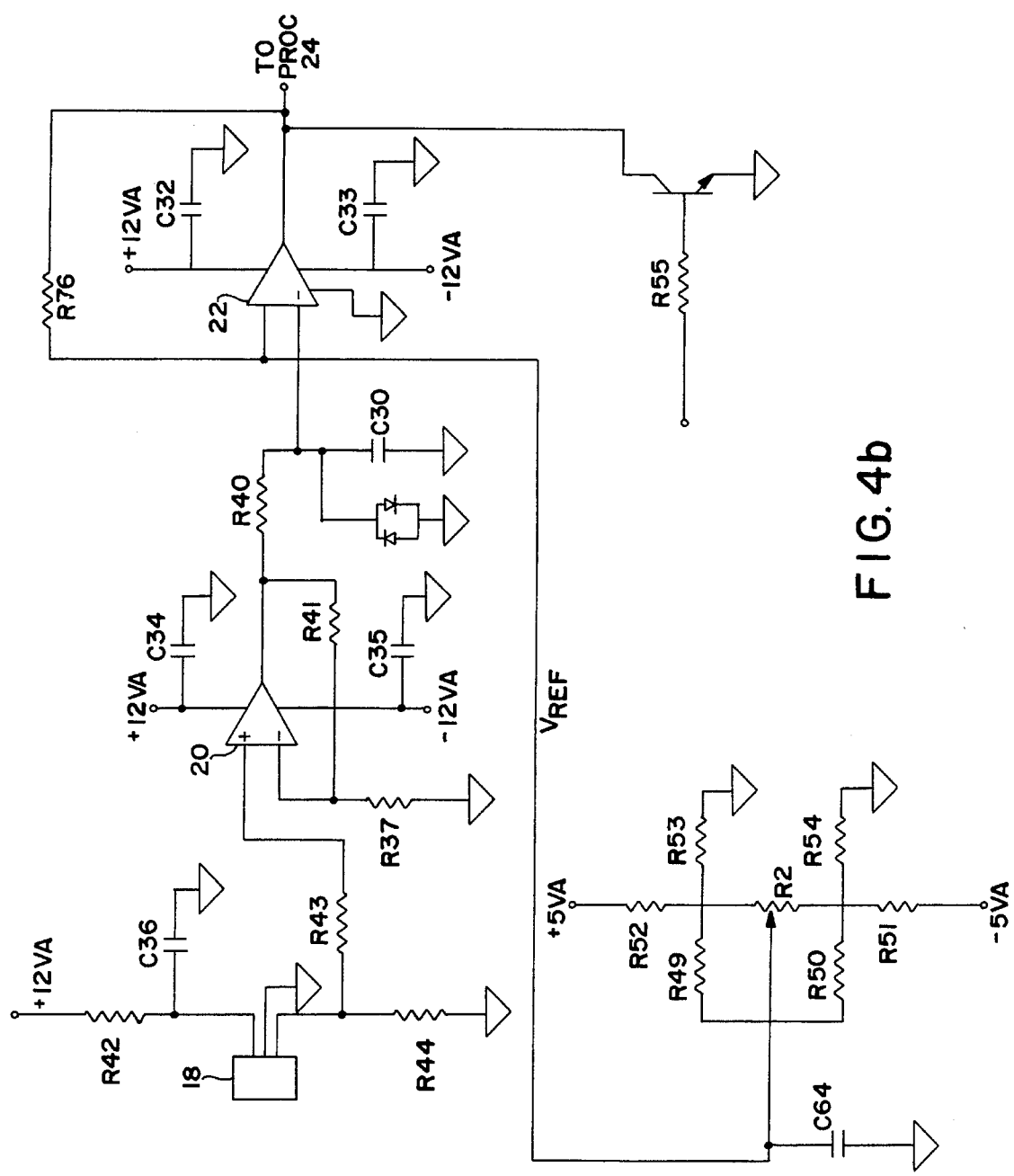

The feedback detection circuit comprising detector 18, amplifier 20 and comparator 22 may be seen in FIG. 4b. The feedback detection circuit provides one bit correction signal to the digital processor that may be implemented in the FPGA 40.

In a further embodiment, the comparator 22 may be a register for measuring the detected signal from the detector 18 and for providing a corresponding correction signal to the processor 24. The correction signal may comprise more than a single bit.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of operating an injection laser diode (ILD) in the presence of ILD temperature changes so that the ILD is not subjected to a potentially harmful operating current, the method comprising the steps of:
    (a) providing an operating current for the ILD from a power source, the operating current
        (i) being provided through a circuit that renders the operating current insensitive to fluctuations in the power source output, and
        (ii) for operating the ILD at a level that does not harm the ILD;
    (b) modulating the operating current by decreasing the operating current so that the ILD is below its maximum level for any level of modulation;
    (c) sensing a temperature of the ILD; and
    (d) changing the operating current proportionally to a change of the sensed temperature.

2. The method of claim 1 wherein the step of changing the operating current comprises the steps of:
    providing a transistor for providing an operating current to the ILD;
    providing a base current to the transistor from an amplifier having as inputs a first signal responsive to the sensed change of temperature and a second signal that is not affected by ILD temperature changes,
    whereby the base current changes the operating current provided by the transistor to respond to temperature changes and to avoid operating current fluctuations due to power source fluctuations.

3. The method of claim further comprising the step of shunting a portion of the operating current from the ILD with a transistor operated by an amplifier having as inputs a stable base voltage and a variable voltage.

4. The method of claim 3 further comprising the steps of stabilizing the stable base voltage by selectively providing a stable reference during an interval when the ILD is not being modulated, the stable reference for providing a predetermined ILD output, and
    comparing (a) an ILD output when the stable reference is being provided, to (b) the predetermined output, to provide a correction signal for stabilizing the stable base voltage.

5. A method of adjusting a maximum available drive current provided to an injection laser diode (ILD) responsive to ILD temperature changes, the method comprising the steps of:
    (a) providing a bridge network comprising plural resistors and a thermistor for providing a first signal related to ILD temperature, and a second signal not affected by ILD temperature changes;
    (b) providing an operating current to the ILD with a transistor having its base current provided by an amplifier having the first and second signals as inputs;
    whereby the base current adjusts the operating current provided by the transistor responsive to ILD temperature changes indicated by changes in the first signal.

6. The method of claim 5 further comprising the step of providing the operating current through a circuit that renders the operating current insensitive to fluctuations in an output from a power source that provides the operating current.

7. A laser driver for an injection laser diode (ILD) comprising:
    first circuit means for providing an operating current to drive the ILD at slightly less than the ILD maximum level;
    a modulator for decreasing the operating current so that the ILD is below its maximum level for all levels of modulation;
    a thermistor for sensing a temperature of the ILD;
    second circuit means for (a) changing the operating current that operates the ILD near its maximum level proportionally to a change of the sensed temperature, and (b) compensating for changes in an output from a power source that provides the operating current.

8. The laser driver of claim 7 wherein the ILD is between said power source and ground, and wherein said modulator is in parallel with the ILD between said power source and ground.

9. The laser driver of claim 8 wherein said second circuit is in series with the ILD and said modulator, and comprises a differential amplifier for sensing a difference between an ILD temperature-related signal and a signal not temperature related.

10. The laser driver of claim 9 further comprising resistors for rendering said operating current insensitive to fluctuations in said power source.

11. A circuit for adjusting a maximum current provided to an injection laser diode (ILD) responsive to ILD temperature changes, the circuit comprising:
    a bridge network of resistors, one of said resistors having a resistance related to ILD temperature;
    a transistor for providing an operating current to the ILD;
    an amplifier for providing a base current to said transistor, said amplifier having as inputs a first signal from said bridge network and a second signal from a feedback resistor connected to an output of said amplifier; and
    a source of a fixed voltage for providing a fixed voltage to said bridge network and to a terminal of said transistor,
    whereby said base current adjusts the operating current provided by said transistor responsive to temperature changes sensed at said one of said resistors having a resistance related to ILD temperature.

12. The circuit of claim 11 further comprising means for providing an operating current to drive the ILD at slightly less than its maximum level, and a modulator for decreasing the operating current so that the ILD is below its laser threshold level for all levels of modulation.

13. A circuit for providing an operating current to an injection laser diode (ILD) comprising:

a power source with a fixed voltage for providing an operating current for two parallel subcircuits, a first of said subcircuits comprising an ILD, and a second of said subcircuits comprising a resistor in series with a transistor for shunting a portion of the operating current from the ILD; and an amplifier for providing a base current for said transistor, said amplifier having as inputs a stable base voltage and a variable voltage for modulating the ILD by operating said transistor to decrease the operating current available to the ILD when the ILD is modulated.

14. The circuit of claim 13 further comprising means for sensing ILD temperature and circuit means for changing a maximum available ILD drive current proportionally to a change of the sensed ILD temperature.

15. The circuit of claim 13 further comprising means for stabilizing said stable base voltage, comprising;

a switch for selectively providing a stable reference during an interval when the ILD is not being modulated, the stable reference for providing a predetermined ILD output, a comparator for comparing (a) an ILD output when the stable reference is being provided, to (b) the predetermined output, and for providing a correction signal for stabilizing said stable base voltage as a result of that comparison.

16. A method of operating an injection laser diode (ILD) so that the ILD is not subjected to a potentially harmful operating current, the method comprising the steps of:

(a) providing an operating current for the ILD from a power source, the operating current (i) being provided through a circuit that renders the operating current insensitive to fluctuations in the power source output, and (ii) for operating the ILD at a level that does not harm the ILD; and (b) modulating the operating current by decreasing the operating current so that the ILD is below its maximum level for any level of modulation.

17. The method of claim 16 further comprising the steps of sensing a temperature of the ILD, and changing a maximum available operating current proportionally to a change of the sensed temperature.

18. The method of claim 16 further comprising the step of shunting a portion of the operating current from the ILD with a transistor operated by an amplifier having as inputs a stable base voltage and a variable voltage related to the modulated operating current.

19. A laser driver for an injection laser diode (ILD) comprising:

first circuit means for providing an operating current to the ILD that operates the ILD near its maximum level;

a modulator for decreasing the operating current so that the ILD is below its maximum level for all levels of modulation; and second circuit means for compensating for changes in an output from a power source that provides the operating current.

20. The laser driver of claim 19 wherein the ILD is between said power source and ground, and wherein said modulator is in parallel with the ILD between said power source and ground.

21. The laser driver of claim 20 wherein said second circuit is in series with the ILD and said modulator, and comprises a differential amplifier for sensing a difference between an ILD temperature related signal and a signal not temperature related.

22. The laser driver of claim 19 further comprising a thermistor for sensing a temperature of the ILD, and wherein said second circuit changes a maximum operating current proportionally to a change of the sensed temperature.

* * * * *